United States Patent
Nogami et al.

(10) Patent No.: US 7,622,767 B2
(45) Date of Patent: Nov. 24, 2009

(54) SEMICONDUCTOR DEVICE WITH T-SHAPED GATE ELECTRODE AND HOLLOW REGION ADJACENT THE GATE ELECTRODE

(75) Inventors: Yoichi Nogami, Tokyo (JP); Toshikazu Hirayama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 12 days.

(21) Appl. No.: 11/943,868

(22) Filed: Nov. 21, 2007

(65) Prior Publication Data
US 2009/0014758 A1 Jan. 15, 2009

(30) Foreign Application Priority Data
Jul. 12, 2007 (JP) ............................ 2007-183550

(51) Int. Cl.
| H01L 29/788 | (2006.01) |
| H01L 29/76  | (2006.01) |
| H01L 29/94  | (2006.01) |
| H01L 31/062 | (2006.01) |
| H01L 31/113 | (2006.01) |
| H01L 31/119 | (2006.01) |

(52) U.S. Cl. ............... 257/317; 257/401; 257/E21.205; 257/E21.624; 257/E21.638

(58) Field of Classification Search ............... 257/317, 257/401, E21.205, E21.624, E21.638
See application file for complete search history.

(56) References Cited

U.S. PATENT DOCUMENTS

| 5,717,232 | A  | * | 2/1998  | Inoue et al. ................. 257/283 |
| 5,869,374 | A  | * | 2/1999  | Wu ............................ 438/291 |
| 6,740,535 | B2 | * | 5/2004  | Singh et al. .................. 438/18 |
| 6,891,235 | B1 | * | 5/2005  | Furukawa et al. ........... 257/408 |
| 6,972,440 | B2 | * | 12/2005 | Singh et al. ................. 257/194 |
| 7,282,423 | B2 | * | 10/2007 | Furukawa et al. ........... 438/422 |
| 7,387,955 | B2 | * | 6/2008  | Ahn et al. ................... 438/574 |
| 7,432,563 | B2 | * | 10/2008 | Behammer ................. 257/401 |
| 2002/0083406 | A1 | * | 6/2002 | Tsai et al. ..................... 716/10 |
| 2006/0118823 | A1 | * | 6/2006 | Parikh et al. ................ 257/194 |
| 2007/0132021 | A1 | * | 6/2007 | Kunii et al. ................. 257/344 |
| 2008/0087916 | A1 | * | 4/2008 | Amasuga et al. ............ 257/194 |
| 2008/0096354 | A1 | * | 4/2008 | Deleonibus ................. 438/270 |

FOREIGN PATENT DOCUMENTS

| JP | 05335343 A | * | 12/1993 |
| JP | 11-274175  |   | 10/1999 |

* cited by examiner

Primary Examiner—Ida M Soward
(74) Attorney, Agent, or Firm—Leydig, Voit & Mayer, Ltd.

(57) ABSTRACT

In a semiconductor device, a SiN first protective insulating film is formed on a semiconductor layer. A T-shaped gate electrode is formed on the semiconductor layer. A SiN second protective insulating film spreads in an umbrella shape from above the T-shaped gate electrode. A hollow region is formed between the two SiN films. The SiN films are coated with a SiN third protective insulating film with the hollow region remaining.

3 Claims, 16 Drawing Sheets

SEMICONDUCTOR DEVICE WITH T-SHAPED GATE ELECTRODE AND HOLLOW REGION ADJACENT THE GATE ELECTRODE

BACKGROUND OF THE INVENTION

1. Field of the Invention

The present invention relates to a semiconductor device whose T-shaped gate is coated with an insulating film, and a method for manufacturing the same. Specifically, the present invention relates to a semiconductor device that suppresses the elevation of capacitance between the gate and the drain to prevent the deterioration of high-frequency characteristics, little fluctuates in the wafer surface, secures high moisture resistance, and can be stably manufactured; and a method for manufacturing such a semiconductor device.

2. Background Art

The generalization of high-frequency semiconductor devices using compound semiconductors, such as GaAs, has been rapidly progressing, and the reduction of costs has been strongly demanded. To respond to such demands, low-cost molded packages have been adopted in place of conventional completely airtight metal packages. However, when a non-airtight package, such as a molded package is used, the high moisture resistance of a semiconductor device is required to prevent deterioration due to moisture.

A method for manufacturing a semiconductor device according to a first conventional embodiment intending the high moisture resistance the semiconductor device will be described referring to the drawings.

First, as shown in FIG. 30, an AlGaAs/GaAs super lattice buffer layer 13, an n-GaAs channel layer 14, an AlGaAs Schottky layer 15, and a GaAs cap layer 16 are sequentially formed as a semiconductor layer 12 on a semi-insulating GaAs substrate 11 using an epitaxial growth process. Si ions are implanted into a predetermined region of the semiconductor layer 12 to form an impurity diffused layer 17, and He ions are implanted to form an element isolating layer (not shown). Then, a SiN film 18 is formed on the semiconductor layer 12 using plasma CVD (chemical vapor deposition).

Next, as shown in FIG. 31, a photo-resist film 21 is applied onto the SiN film 18 to form an opening using lithography. Using the photo-resist film 21 as a mask, the SiN film 18 and the GaAs cap layer 16 are etched by ICP (inductively coupled plasma) to form an opening 22. Thereafter, the photo-resist film 21 is removed. Then, as shown in FIG. 32, a WSi/Au film 23 is formed on the entire surface so as to bury the opening 22 using sputtering.

Next, as shown in FIG. 33, a photo-resist film 24 is applied onto the WSi/Au film 23, and the photo-resist film 24 other than in the vicinity of the opening 22 is removed by lithography. By ion milling using the photo-resist film 24 as a mask, the WSi/Au film 23 is patterned to form a T-shaped gate electrode 25 on the semiconductor layer 12. Thereafter, the photo-resist film 24 is removed.

Next, as shown in FIG. 34, a photo-resist film 26 is applied onto the entire surface, and the photo-resist film 26 on the impurity diffused layer 17 is removed by lithography. Using the photo-resist film 26 as a mask, the SiN film 18 is etched by RIE (reactive ion etching).

Next, as shown in FIG. 35, an AuGe/Ni/Au film is vapor-deposited using vacuum deposition and is subjected to a liftoff process to form a source electrode 27 and a drain electrode 28 ohmic-contacting the impurity diffused layer 17. Then, as shown in FIG. 36, a SiN film 29 is formed on the entire surface so as to coat the T-shaped gate electrode 25.

In the first conventional embodiment as described above, the semiconductor device was protected from corrosion due to moisture by coating the surfaces of the semiconductor layer 12, the T-shaped gate electrode 25 and the like by a thick SiN film 29 formed by plasma CVD or the like. However, when the T-shaped gate electrode 25 was used to prevent the elevation of gate resistance, capacitance components increased because the SiN film 18 having a high dielectric constant was present between the overhanging portion of the T-shaped gate electrode 25 and the semiconductor layer 12, causing a problem of the deterioration of high-frequency characteristics.

A method for manufacturing a semiconductor device according to the second conventional embodiment that solves problems in the first conventional embodiment will be described referring to the drawings.

First, as shown in FIG. 37, in the same manner as in the first embodiment, a semiconductor layer 12 is formed on a semi-insulating GaAs substrate 11, and Si ions are implanted into a predetermined region of the semiconductor layer 12 to form an impurity diffused layer 17. Then, a $SiO_2$ film 19 is formed on the semiconductor layer 12 using plasma CVD.

Next, as shown in FIG. 38, a photo-resist film 21 is applied onto the $SiO_2$ film 19 to form an opening using lithography. Using the photo-resist film 21 as a mask, the $SiO_2$ film 19 and the GaAs cap layer 16 are etched by ICP (inductively coupled plasma) to form an opening 22. Thereafter, the photo-resist film 21 is removed. Then, as shown in FIG. 39, a WSi/Au film 23 is formed on the entire surface so as to bury the opening 22 using sputtering.

Next, as shown in FIG. 40, a photo-resist film 24 is applied onto the WSi/Au film 23, and the photo-resist film 24 other than in the vicinity of the opening 22 is removed by lithography. By ion milling using the photo-resist film 24 as a mask, the WSi/Au film 23 is patterned to form a T-shaped gate electrode 25 on the semiconductor layer 12. Thereafter, the photo-resist film 24 is removed.

Next, as shown in FIG. 41, the $SiO_2$ film 19 is entirely removed using buffered hydrofluoric acid (BHF).

Next, as shown in FIG. 42, a thin SiN film 18 if formed on the entire surface. Then, a photo-resist film 26 is applied onto the entire surface, and the photo-resist film 26 on the impurity diffused layer 17 is removed by lithography. Using the photo-resist film 26 as a mask, the SiN film 18 is etched by RIE.

Next, as shown in FIG. 43, an AuGe/Ni/Au film is vapor-deposited using vacuum deposition and is subjected to a liftoff process to form a source electrode 27 and a drain electrode 28 ohmic-contacting the impurity diffused layer 17.

Then, as shown in FIG. 44, a SiN film 29 having a thickness equal to or larger than the thickness of the T-shaped gate electrode 25 is formed on the entire surface. By thus firming the thick SiN film 29 after forming the T-shaped gate electrode 25, a hollow portion 32 is formed under the spread portion of the T-shaped gate electrode 25. Thereby, the elevation of capacitance between the gate and the drain, which caused problems in the first conventional embodiment, can be prevented.

In the second conventional embodiment, however, since the SiN film 29 enters also under the spread portion of the T-shaped gate electrode 25 to a certain extent, the fluctuation of the capacitance between the gate and the drain in the wafer surface increases. Also depending on the shape and size of the T-shaped gate electrode 25, the hollow portion 32 may not be accurately formed, or a sufficient effect to reduce the capacitance between the gate and the drain may not be obtained. Furthermore, since the SiN film 18 is formed after forming the T-shaped gate electrode 25, the coverage and quality of the SiN film 18 coating the surface of the semiconductor layer 12 under the spread portion of the T-shaped gate electrode 25 are lowered, causing a problem of lowering moisture resistance.

A method for manufacturing a semiconductor device according to the third conventional embodiment that solves problems in the first and second conventional embodiments will be described referring to the drawings (e.g., refer to Japanese Patent Laid-Open No. 11-274175).

First, as shown in FIG. 45, etching is performed to the operative layer of a GaAs substrate 11 using a photo-resist pattern as a mask to form a recess. A SiN film 18 and a $SiO_2$ film 19a are sequentially formed on the GaAs substrate 11. The $SiO_2$ film 19a and the SiN film 18 are processed by dry etching using the photo-resist pattern as a mask to form an opening 22. After forming a metal film on the entire surface so as to bury the opening 22, the metal film is processed by dry etching using the photo-resist pattern as a mask to form a T-shaped gate electrode 25. Further, a $SiO_2$ film 19b is formed on the entire surface to coat the head portion of the T-shaped gate electrode 25.

Next, as shown in FIG. 46, the $SiO_2$ films 19a, 19b and SiN film 18 in regions adjacent to the both ends of the T-shaped gate electrode 25 are selectively removed by wet etching using the photo-resist pattern as a mask. A source electrode 27 and a drain electrode 28 are formed in the opened region by a predetermined method. Thereafter, a SiN film 29 is formed on the entire surface.

Next, as shown in FIG. 47, the SiN film 29 is selectively removed by dry etching using the photo-resist pattern as a mask to form an opening 37 on the T-shaped gate electrode 25. Thereafter, only the $SiO_2$ films 19a and 19b around the T-shaped gate electrode 25 are selectively removed by vapor etching through the opening 37. Next, as shown in FIG. 48, by forming a third SiN film 33 on the entire surface to close the opening 37, a hollow portion 32 is formed around the T-shaped gate electrode 25. Thereby, the elevation of capacitance between the gate and the drain, which caused a problem in the first conventional embodiment, can be suppressed, and the deterioration of high-frequency characteristics can be prevented. Furthermore, the fluctuation in the wafer surface, which caused a problem in the second conventional embodiment, can be reduced, and high moisture resistance can be secured.

SUMMARY OF THE INVENTION

In the third conventional embodiment, however, since the mechanical strength of the SiN film 29 is low in the state shown in FIG. 47, the SiN film 29 is missing during the manufacturing process. Therefore, a problem wherein a structure having a hollow portion 32 as shown in FIG. 48 could not stably manufactured was caused.

To solve the above-described problems, an object of the present invention is to provide a semiconductor device that suppresses the elevation of capacitance between the gate and the drain to prevent the deterioration of high-frequency characteristics, has little fluctuation in the wafer surface, secures high moisture resistance, and can be stably manufactured; and a method for manufacturing such a semiconductor device.

According to one aspect of the present invention, a semiconductor device comprises: a semiconductor layer, a first protective insulating film formed on said semiconductor layer, a T-shaped gate electrode formed on said semiconductor layer, a second protective insulating film stretched in an umbrella shape from above said T-shaped gate electrode to form a hollow portion between said first protective insulating film and said second protective insulating film, and a third protective insulating film to coat said first protective insulating film and said second protective insulating film leaving said hollow portion.

According to the present invention, a semiconductor device that suppresses the elevation of capacitance between the gate and the drain to prevent the deterioration of high-frequency characteristics, has little fluctuation in the wafer surface, and secures high moisture resistance can be stably manufactured.

Other and further objects, features and advantages of the invention will appear more fully from the following description.

DETAILED DESCRIPTION OF THE PREFERRED EMBODIMENTS

First Embodiment

Figure 1:
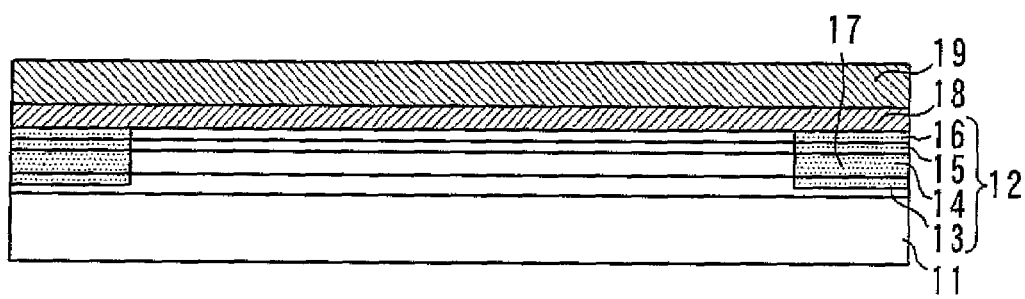
FIGS. 1-10 are sectional views for explaining a method of manufacturing a semiconductor device according to First Embodiment of the present invention.

A method for manufacturing a semiconductor device according to the first embodiment of the present invention will be described hereunder referring to the drawings.

First, as shown in FIG. 1, an AlGaAs/GaAs super lattice buffer layer 13, an n-GaAs channel layer 14, an AlGaAs Schottky layer 15; and a GaAs cap layer 16 are sequentially formed as a semiconductor layer 12 on a semi-insulating GaAs substrate 11 using an epitaxial growth process Si ions are implanted into a predetermined region of the semiconductor layer 12 to form an impurity diffused layer 17, and He ions are implanted to form an element isolating layer (not shown). Then, a SiN film 18 (first protective insulating film) is formed on the semiconductor layer 12 using plasma CVD. Further, a $SiO_2$ film 19 (sacrifice film) is formed on the SiN film 18.

Figure 2:
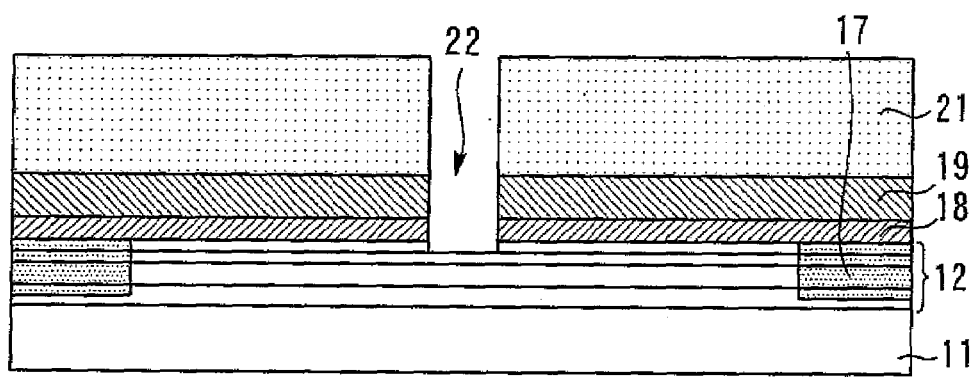
Figure 3:
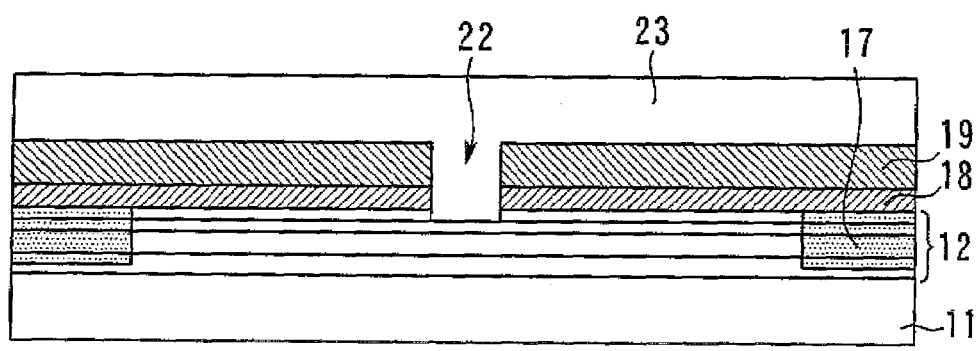

Next, as shown in FIG. 2, a photo-resist film 21 is applied onto the $SiO_2$ film 19 to form an opening using lithography. Using the photo-resist film 21 as a mask, the $SiO_2$ film 19, the SiN film 18 and the GaAs cap layer 16 are etched by ICP (inductively coupled plasma) to form an opening 22. Thereafter, the photo-resist film 21 is removed. Then, as shown in FIG. 3, a WSi/Au film 23 (metal film) is formed on the entire surface so as to bury the opening 22 using sputtering.

Figure 4:
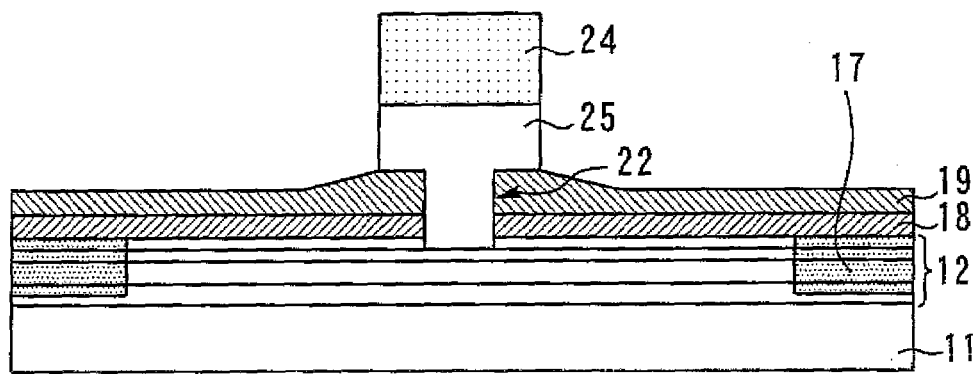

Next, as shown in FIG. 4, a photo-resist film 24 is applied onto the WSi/Au film 23, and the photo-resist film 24 other than in the vicinity of the opening 22 is removed by lithography. By ion milling using the photo-resist film 24 as a mask, the WSi/Au film 23 is patterned to form a T-shaped gate electrode 25 on the semiconductor layer 12. Thereafter, the photo-resist film 24 is removed.

Figure 5:
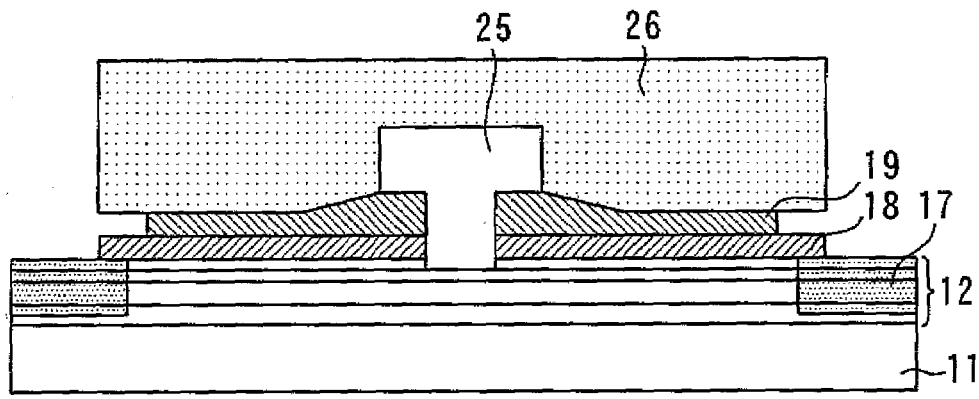

Next, as shown in FIG. 5, a photo-resist film 26 is applied onto the entire surface, and the photo-resist film 26 on the impurity diffused layer 17 is removed by lithography. Using the photo-resist film 26 as a mask, the SiN film 18 is etched by RIE using $SF_6$/He etching gas. Then, the $SiO_2$ film 19 is selectively etched from the opening of the photo-resist film 26 using buffered hydrofluoric acid to form a side etch in the $SiO_2$ film 19 in the vicinity of the impurity diffused layer 17.

Figure 6:
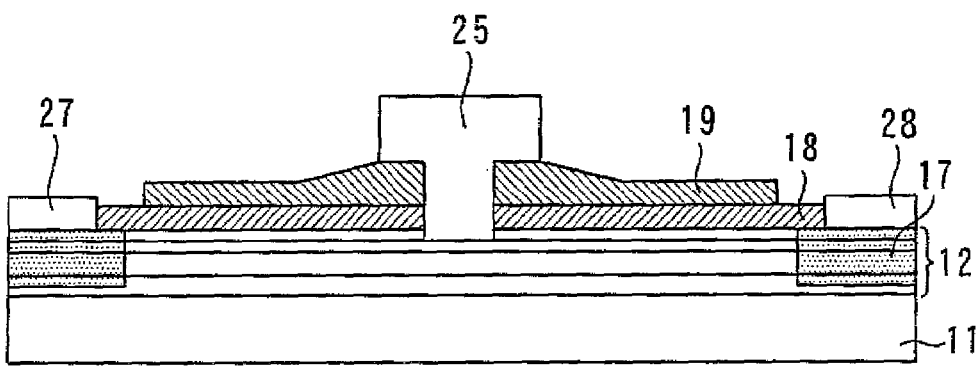
Figure 7:
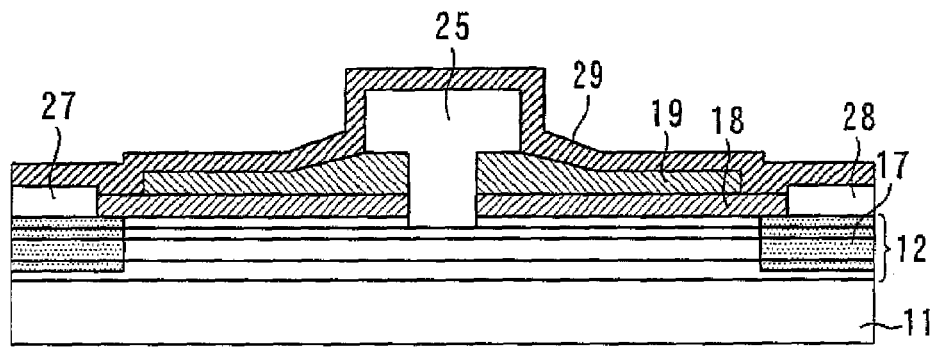

Next, as shown in FIG. 6, an AuGe/Ni/Au film is vapor-deposited using vacuum deposition and is subjected to a liftoff process to form a source electrode 27 and a drain electrode 28 ohmic-contacting the impurity diffused layer 17. Then, as shown in FIG. 7, a SiN film 29 (second protective insulating film) is formed on the entire surface so as to coat the T-shaped gate electrode 25.

Figure 8:
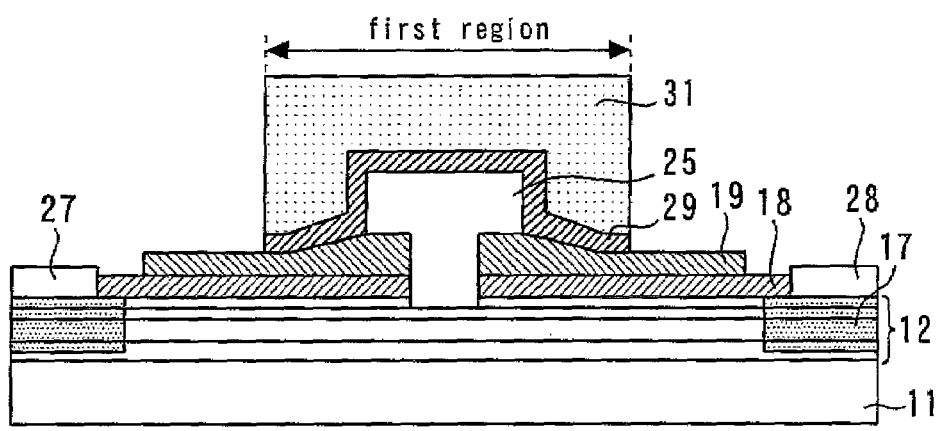

Next, as shown in FIG. 8, a photo-resist film 31 is applied onto the SiN film 29, and the photo-resist film 31 outside the first region in the periphery of the T-shaped gate electrode 25 is removed by lithography. The SiN film 29 is etched by RIE using the photo-resist film 31 as a mask and using $SF_6$/He etching gas, to selectively remove the SiN film 29 outside the first region. Here, since the $SF_6$/He etching gas has characteristics to selectively remove the SiN against $SiO_2$, the etching rate lowers at the surface of the $SiO_2$ film 19 to suppress excessive etching, and processing can be well controlled.

Figure 9:
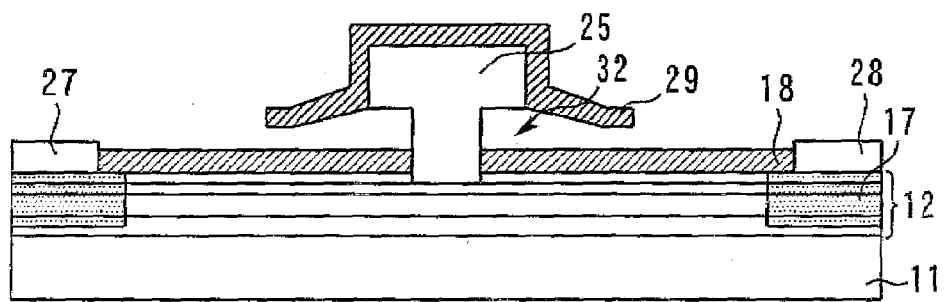

Next, as shown in FIG. 9, all the $SiO_2$ film 19 is selectively removed using buffered hydrofluoric acid to form a hollow portion 32 between the SiN film 18 and the SiN film 29. Thereafter, the photo-resist film 31 is removed.

Figure 10:
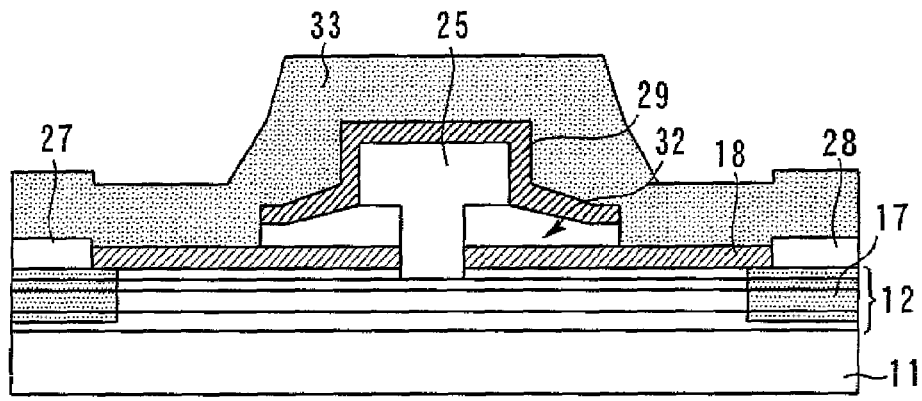

Next, as shown in FIG. 10, the SiN film 18 and the SiN film 29 are coated with a SiN film 33 (third protective insulating film) leaving the hollow portion 32. By the above-described process, the semiconductor device according to the first embodiment is manufactured.

In the semiconductor device according to the first embodiment, the SiN film 18 and the T-shaped gate electrode 25 are formed on the semiconductor layer 12. The SiN film 29 is stretched from above the T-shaped gate electrode 25 in an umbrella shape. The hollow portion 32 is formed between the SiN film 29 and the SiN film 18. Further, the SiN film 18 and the SiN film 29 are coated with a SiN film 33 leaving the hollow portion 32.

Since the hollow portion 32 wherein no insulating films under the stretched portion of the T-shaped gate electrode 25 is formed, the elevation of capacitance between the gate and the drain can be suppressed, and the deterioration of high-frequency characteristics can be prevented.

The distance between the end of the SiN film 29 stretched from above the T-shaped gate electrode 25 in an umbrella shape and the SiN film 18 is narrower than the distance between the stretched portion of the T-shaped gate electrode 25 and the SiN film 18. Thereby, since the entering of the SiN film 33 into the hollow portion 32 can be suppressed, the fluctuation in the wafer surface can be reduced.

Since the SiN film 18 is formed on the semiconductor layer 12 before forming the T-shaped gate electrode 25, the coverage and quality of the SiN film 18 that coats the surface of the semiconductor layer 12 under the stretched portion of the T-shaped gate electrode 25 can be improved, and high moisture resistance can be secured.

In addition, the mechanical strength of the SiN film 29 stretched from above the T-shaped gate electrode 25 in an umbrella shape as shown in FIG. 9 is high, the SiN film 29 is not missing during the manufacturing process. Therefore, a structure having a hollow portion 32 as shown in FIG. 10 can be stably manufactured.

Second Embodiment

A method for manufacturing a semiconductor device according to the second embodiment of the present invention will be described referring to the drawings.

Figure 11:
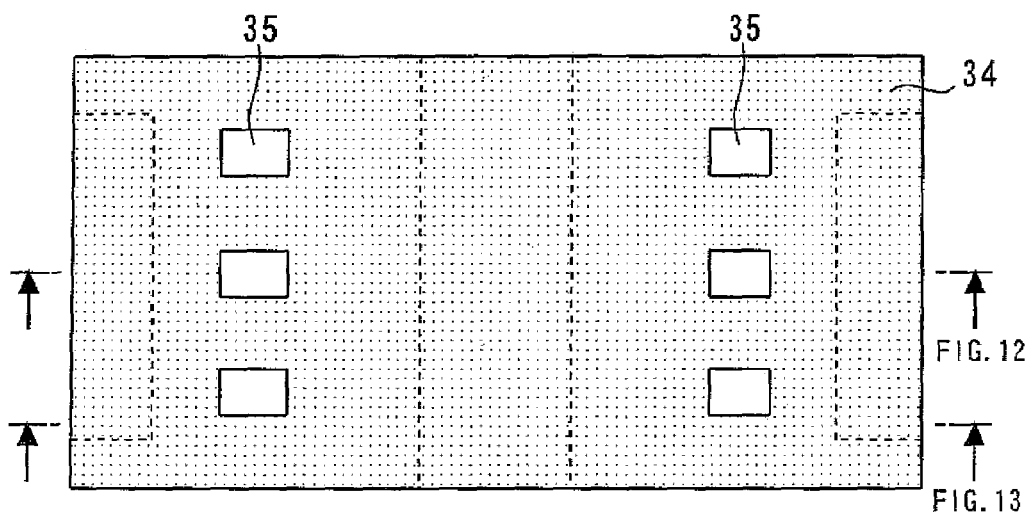
FIGS. 11, 14, 17, 20, 23 are plan views for explaining a method of manufacturing a semiconductor device according to Second Embodiment of the present invention.
Figure 12:
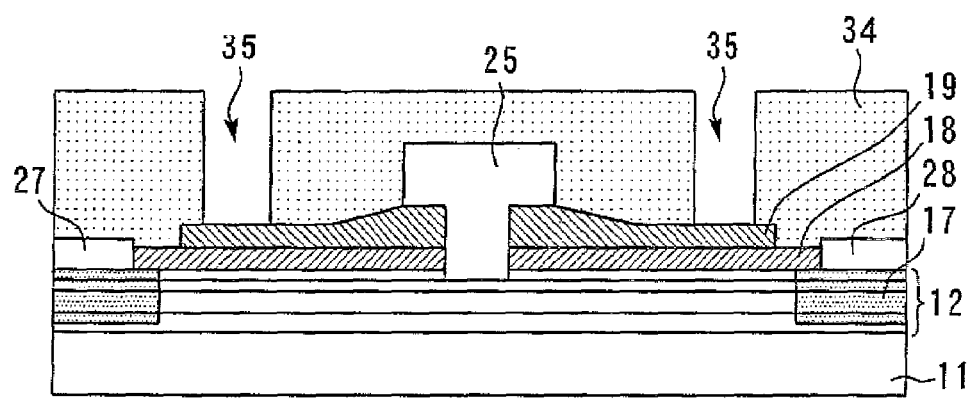
FIGS. 12, 13, 15, 16, 18, 19, 21, 22, 24, 25 are sectional views for explaining a method of manufacturing a semiconductor device according to Second Embodiment of the present invention.
Figure 13:
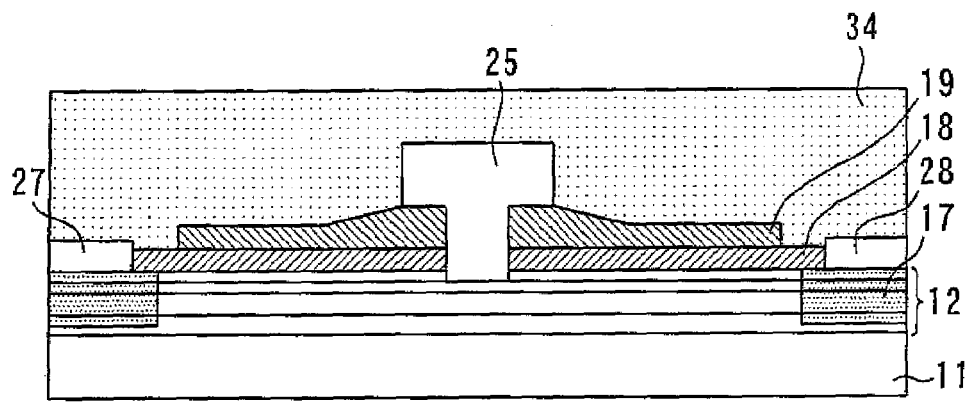

First, the process shown in FIGS. 1 to 6 is carried out in the same manner as in the first embodiment. Next, as shown in the top view of FIG. 11 and sectional views of FIGS. 12 and 13, a photo-resist film 34 is applied on the entire surface. Then, openings 35 are formed in the photo-resist film 34 at a regular interval in the gate-width direction.

Figure 14:
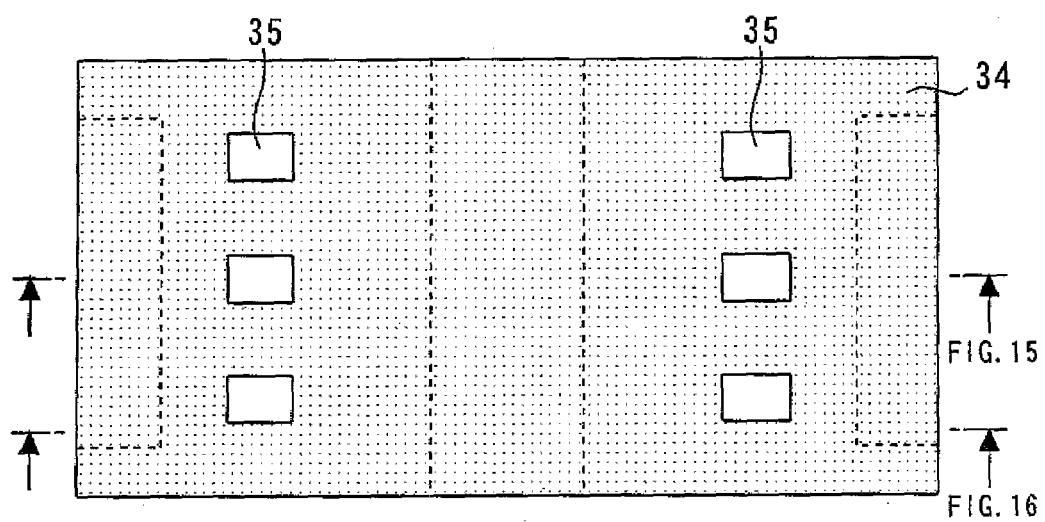
Figure 15:
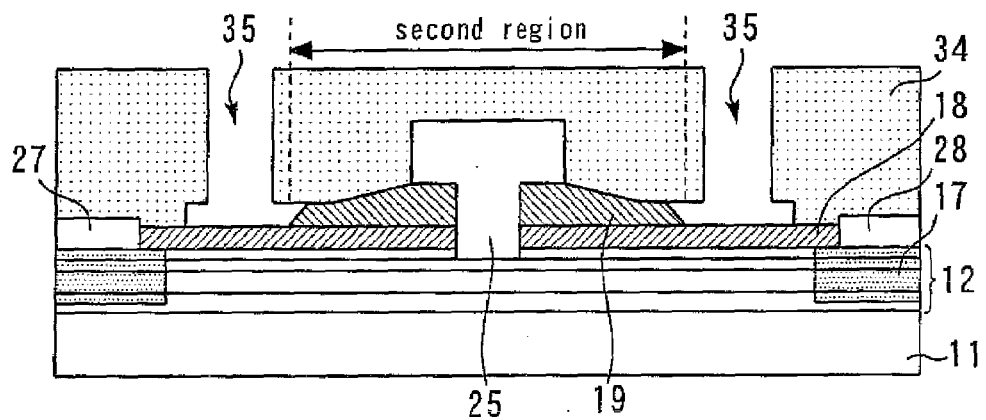
Figure 16:
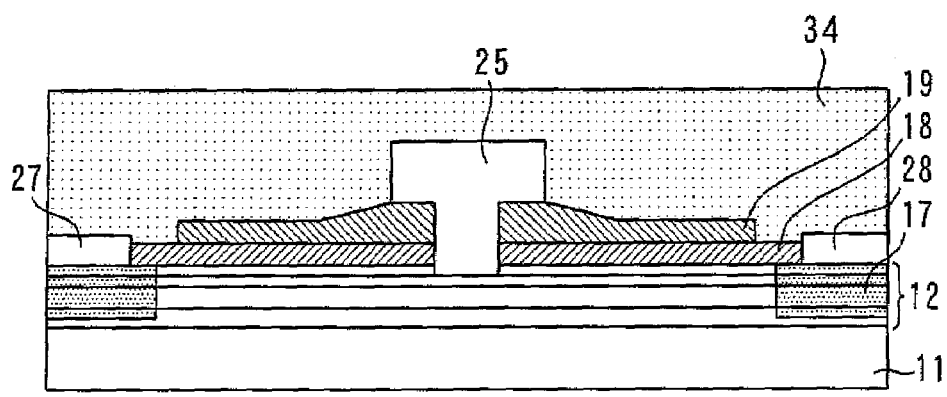

Next, as shown in the top view of FIG. 14 and sectional views of FIGS. 15 and 16, in a part of the region in the gate-width direction, the $SiO_2$ film 19 outside the second region around the T-shaped gate electrode 25 is selectively removed using the photo-resist film 34 as a mask using buffered hydrofluoric acid. Here, the second region is narrower than the first region. Thereafter, the photo-resist film 34 is removed.

Figure 17:
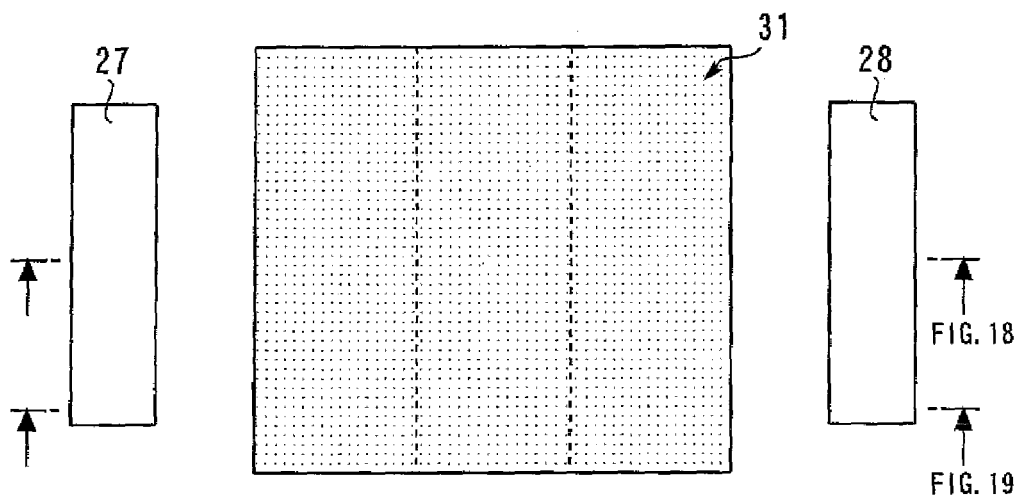
Figure 18:
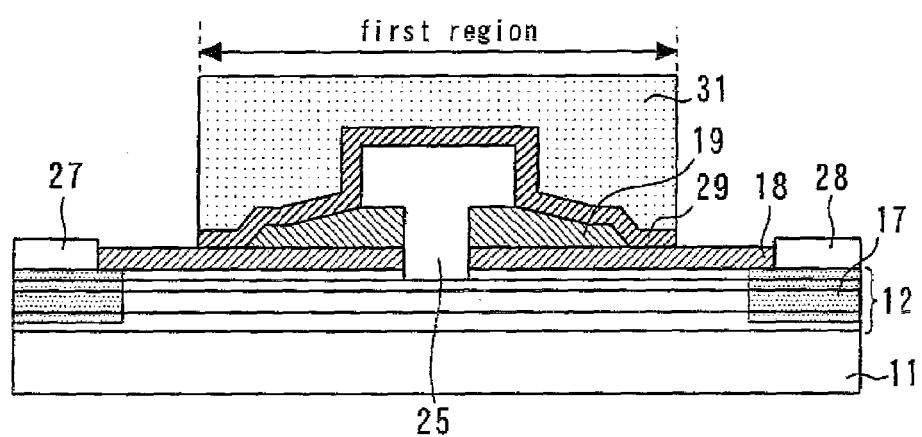
Figure 19:
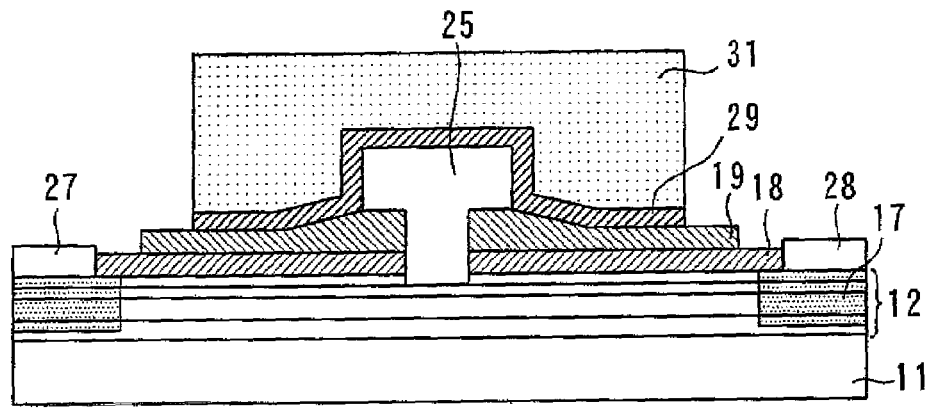

Next, as shown in the top view of FIG. 17 and sectional views of FIGS. 18 and 19, a SiN film 29 is formed on the entire surface so as to coat the T-shaped gate electrode 25. At this time, the SiN film 29 adheres to the SiN film 18 in a part of the region in the gate-width direction. Then, a photo-resist film 31 is applied onto the SiN film 29, and the photo-resist film 31 outside the first region around the T-shaped gate electrode 25 is removed by lithography. The SiN film 29 is etched by RIE using the photo-resist film 31 as a mask and using $SF_6$/He etching gas to selectively remove the SiN film 29 outside the first region.

Figure 20:
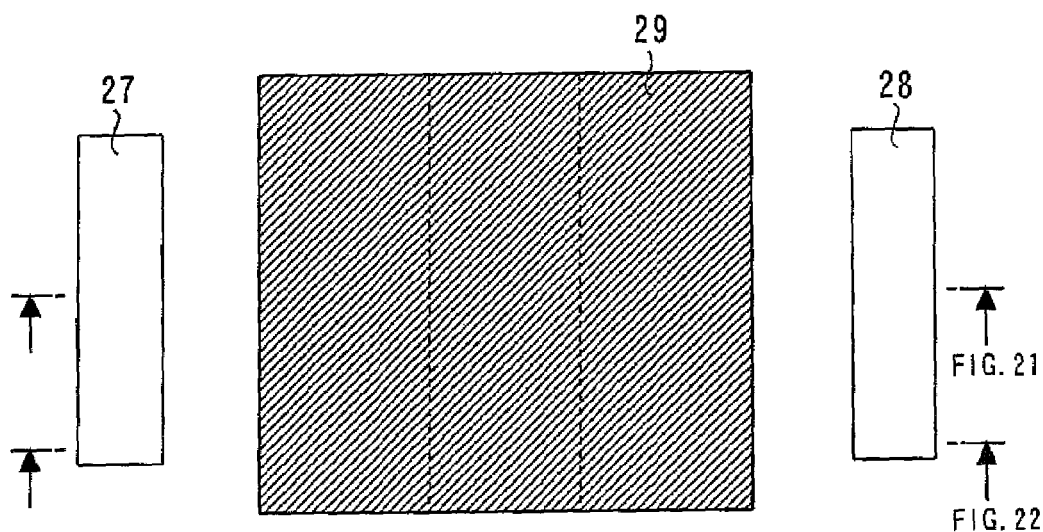
Figure 21:
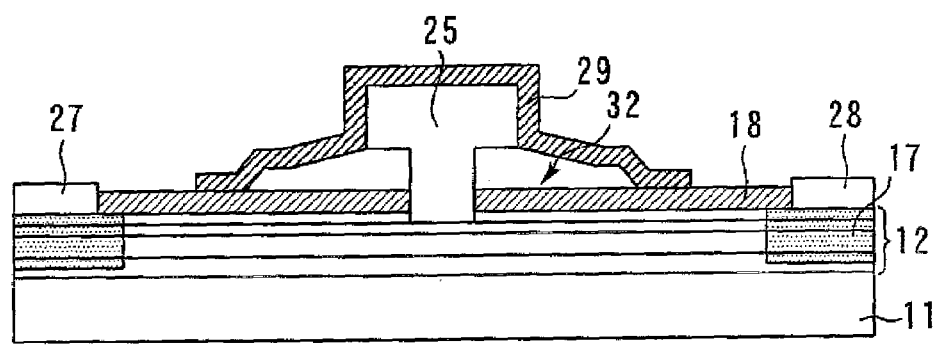
Figure 22:
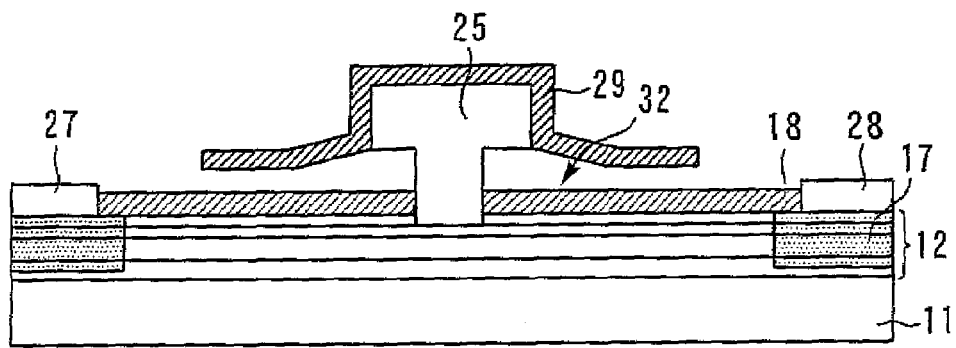

Next, as shown in the top view of FIG. 20 and sectional views of FIGS. 21 and 22, all the $SiO_2$ film 19 is selectively removed using buffered hydrofluoric acid to form a hollow portion 32 between the SiN film 18 and the SiN film 29. Thereafter, the photo-resist film 31 is removed.

Figure 23:
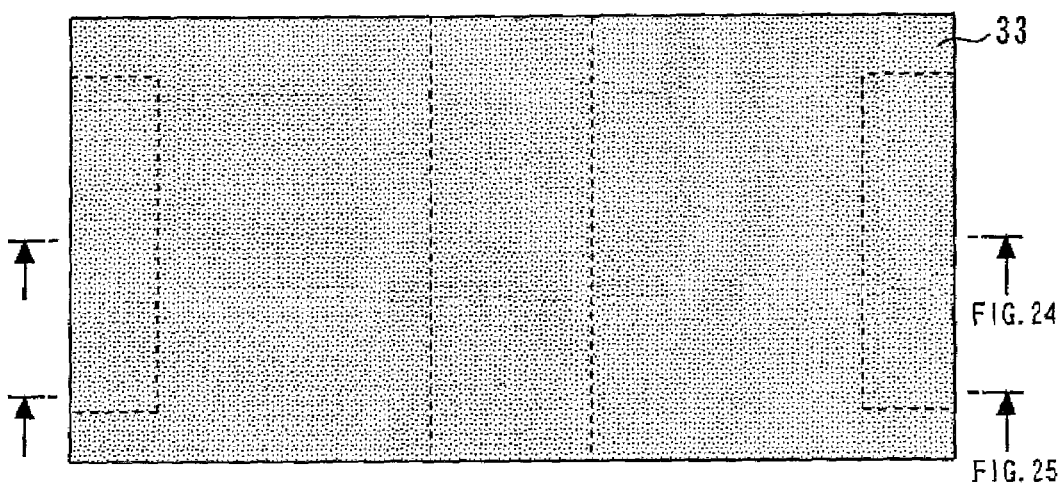
Figure 24:
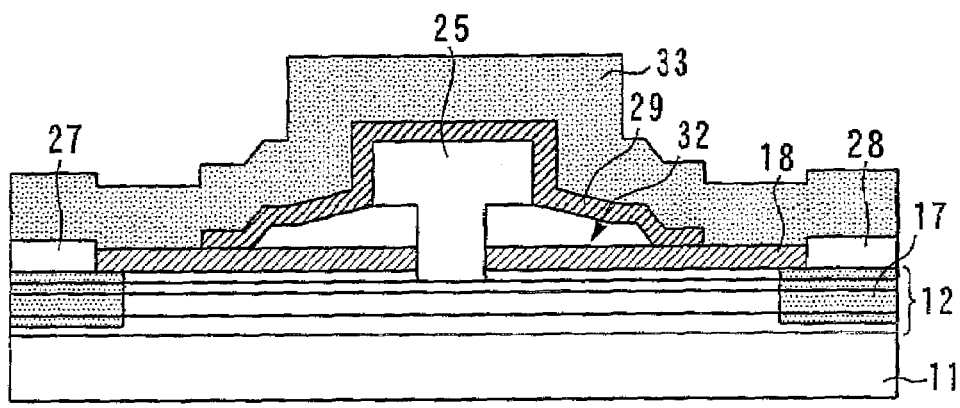
Figure 25:
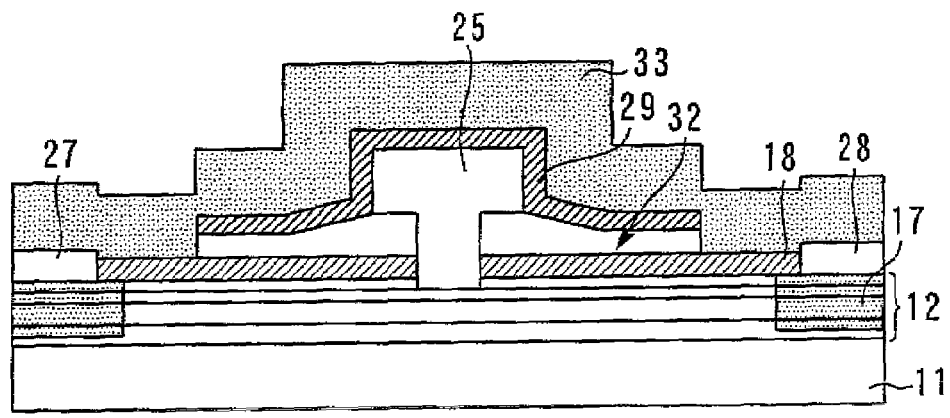

Next, as shown in the top view of FIG. 23 and sectional views of FIGS. 24 and 25, the SiN film 18 and the SiN film 29 are coated with a SiN film 33 leaving the hollow portion 32. By the above-described process, the semiconductor device according to the second embodiment is manufactured.

According to the second embodiment, the effects equivalent to the effects of the first embodiment can be obtained. In the semiconductor device according to the second embodiment, in a part of the region in the gate-width direction, the end portion of the SiN film 29 is adhered to the SiN film 18 in a state leaving the hollow portion 32 in the vicinity of the T-shaped gate electrode 25. Thereby, the mechanical strength of the SiN film 29 stretched in an umbrella shape can be made higher than the mechanical strength of the SiN film 29 in the first embodiment. Therefore, the SiN film 29 is not missing during the manufacturing process, and a structure having a hollow portion 32 can be more stably manufactured.

Third Embodiment

A method for manufacturing a semiconductor device according to the third embodiment of the present invention will be described referring to the drawings.

Figure 26:
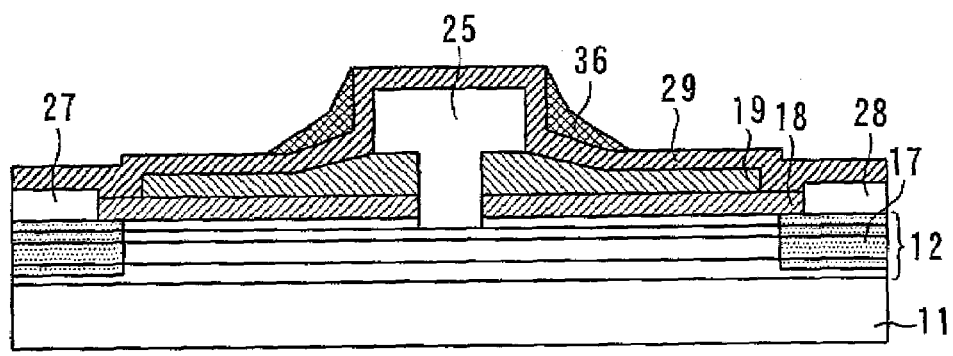
FIGS. 26-29 are sectional views for explaining a method of manufacturing a semiconductor device according to Third Embodiment of the present invention.

First, the process shown in FIGS. 1 to 7 is carried out in the same manner as in the first embodiment. Next, as shown in FIG. 26, a SOG film 36 (reinforcing material) is applied onto a SiN film 29 by spin coating. Then, a heat treatment is performed and the SOG film 36 is etched back using ion milling to remove the SOG film 36 present in the areas other than the sidewalls of the stretched portion of the T-shaped gate electrode 25.

Figure 27:
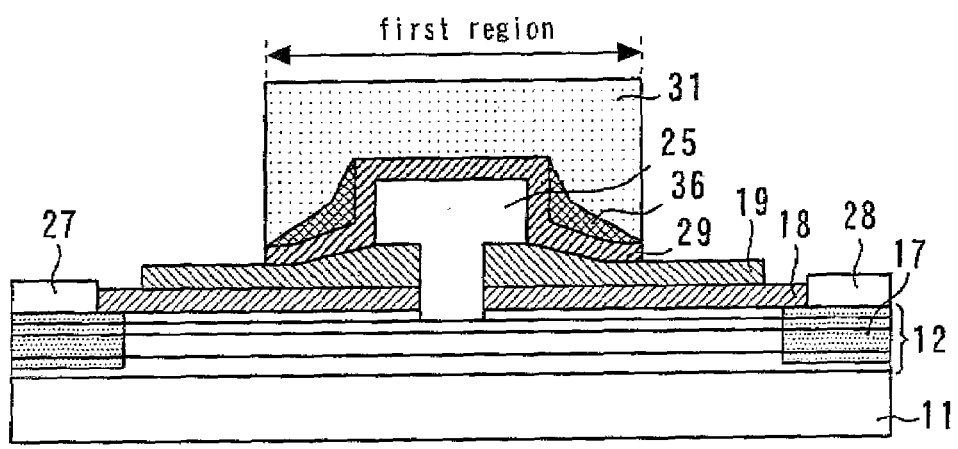

Next, as shown in FIG. 27, a photo-resist film 31 is applied onto the SiN film 29, and the photo-resist film 31 outside the first region in the periphery of the T-shaped gate electrode 25 is removed by lithography. The SiN film 29 is etched by RIE using the photo-resist film 31 as a mask and using $SF_6$/He etching gas, to selectively remove the SiN film 29 outside the first region. Here, since the $SF_6$/He etching gas has characteristics to selectively remove the SiN against $SiO_2$, the etching rate lowers at the surface of the $SiO_2$ film 19 to suppress excessive etching, and processing can be well controlled.

Figure 28:
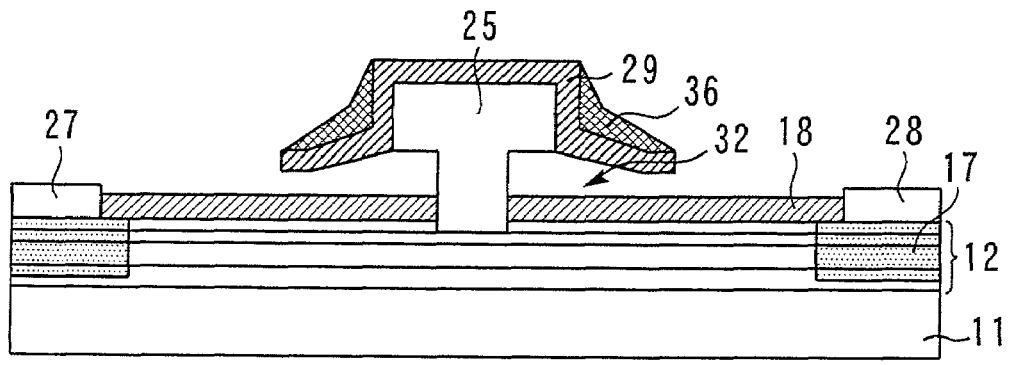

Next, as shown in FIG. 28, all the $SiO_2$ film 19 is selectively removed using buffered hydrofluoric acid to form a hollow portion 32 between the SiN film 18 and the SiN film 29. Thereafter, the photo-resist film 31 is removed.

Figure 29:
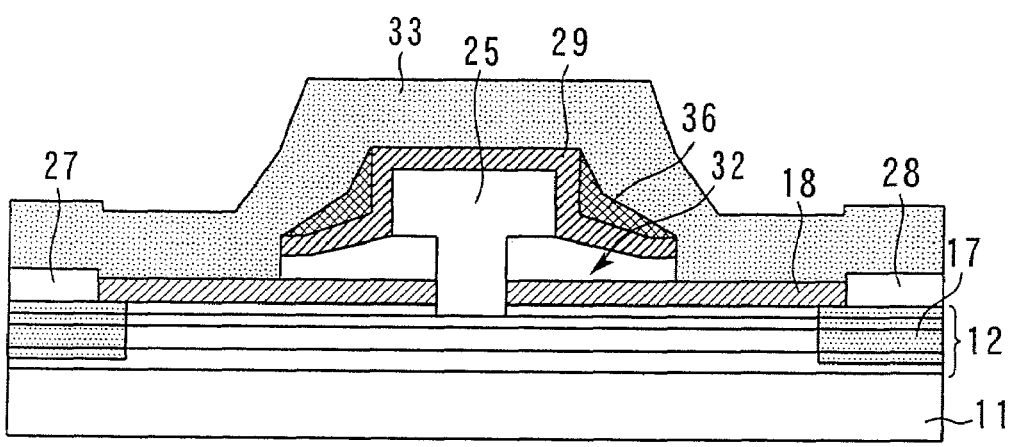
Figure 30:
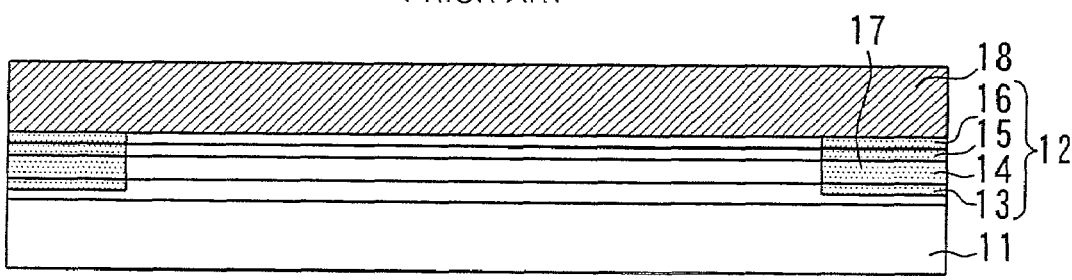
FIGS. 30-36 are sectional views for explaining a method of manufacturing a semiconductor device according to First conventional embodiment.
Figure 31:
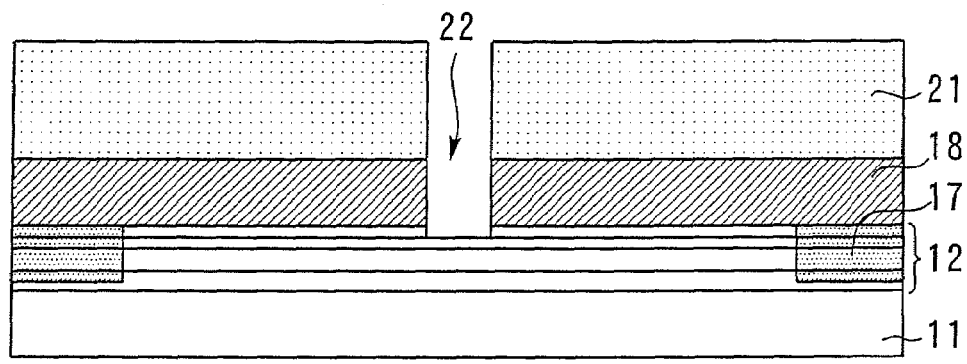
Figure 32:
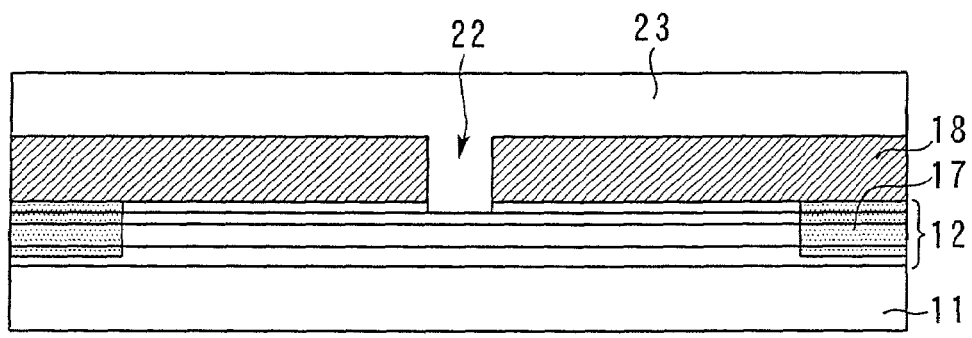
Figure 33:
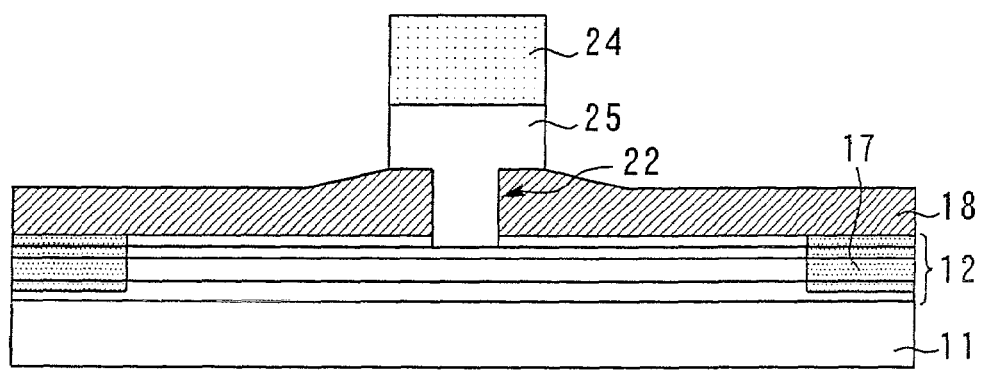
Figure 34:
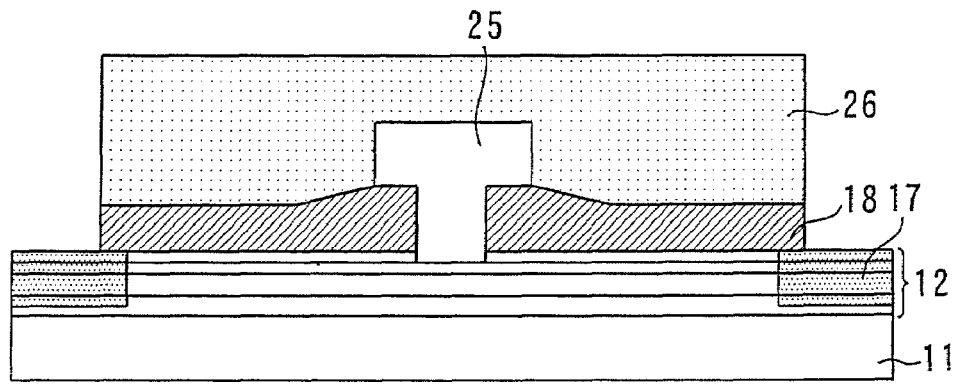
Figure 35:
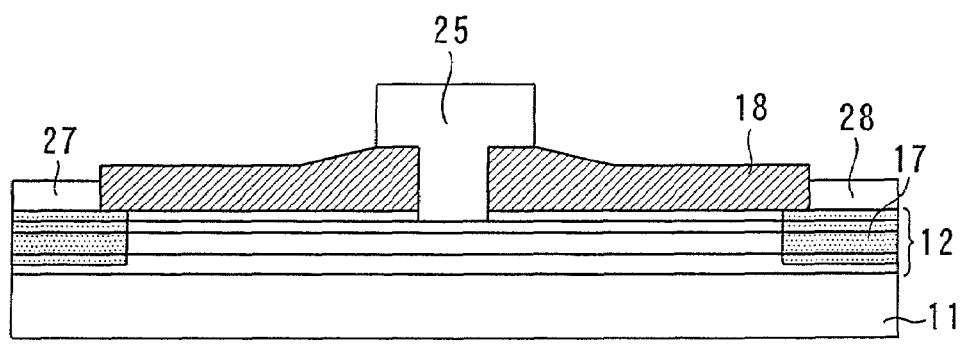
Figure 36:
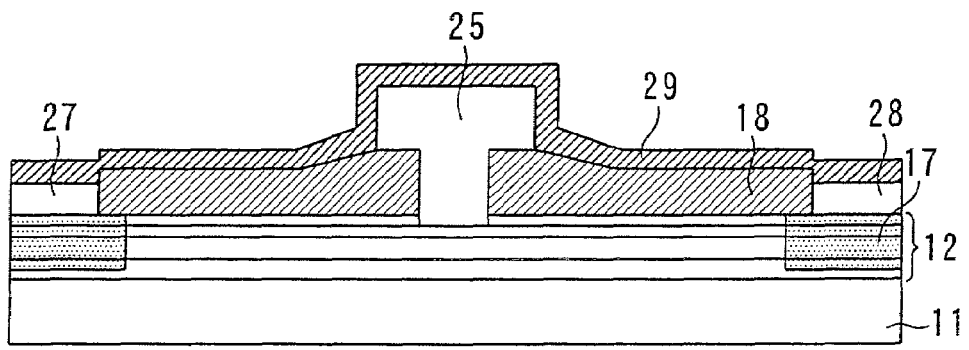
Figure 37:
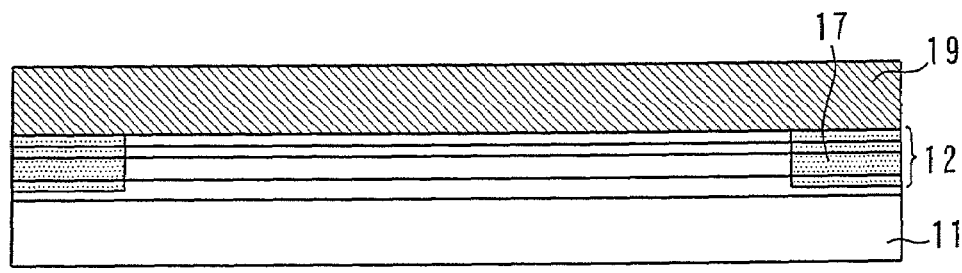
FIGS. 37-44 are sectional views for explaining a method of manufacturing a semiconductor device according to Second conventional embodiment.
Figure 38:
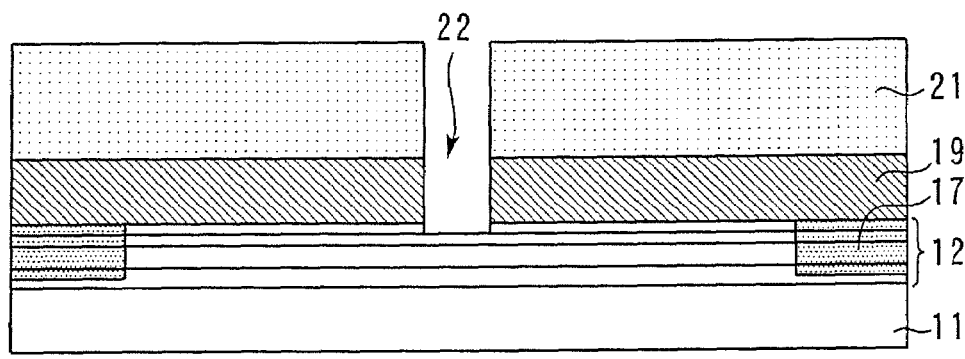
Figure 39:
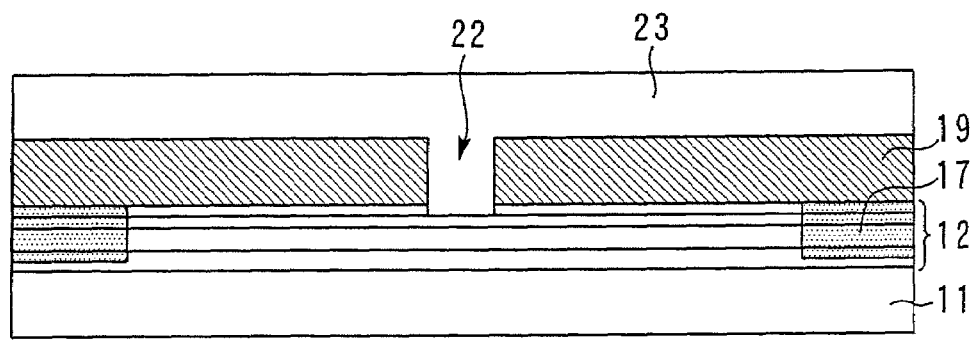
Figure 40:
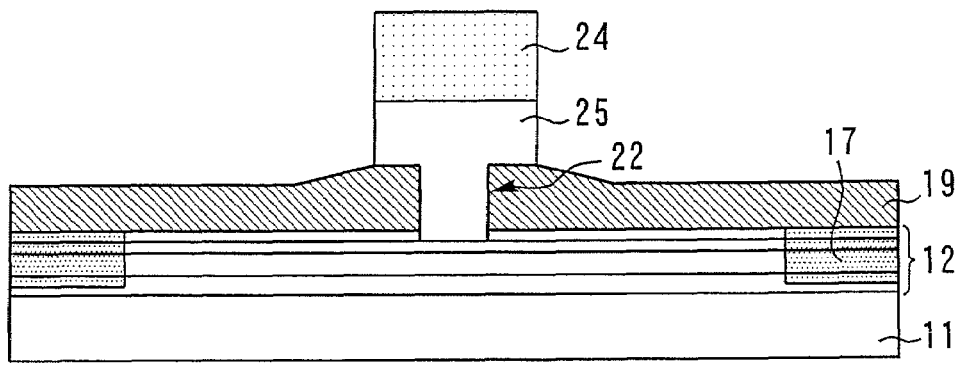
Figure 41:
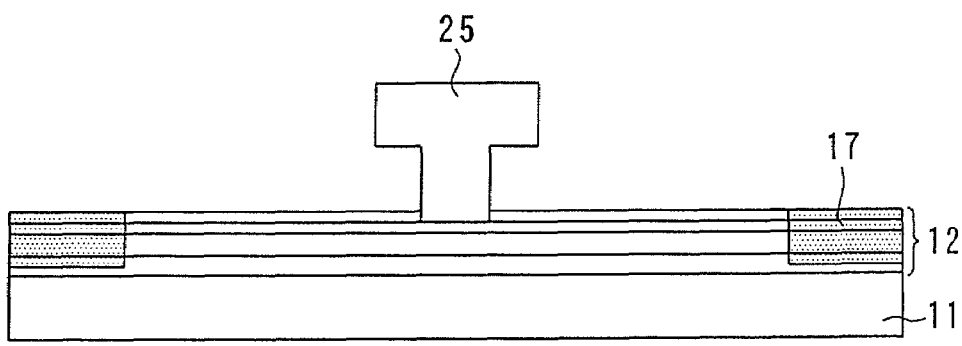
Figure 42:
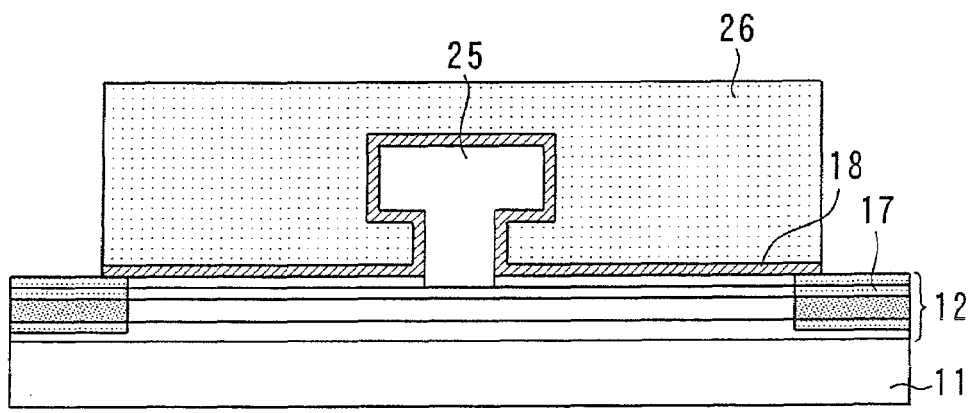
Figure 43:
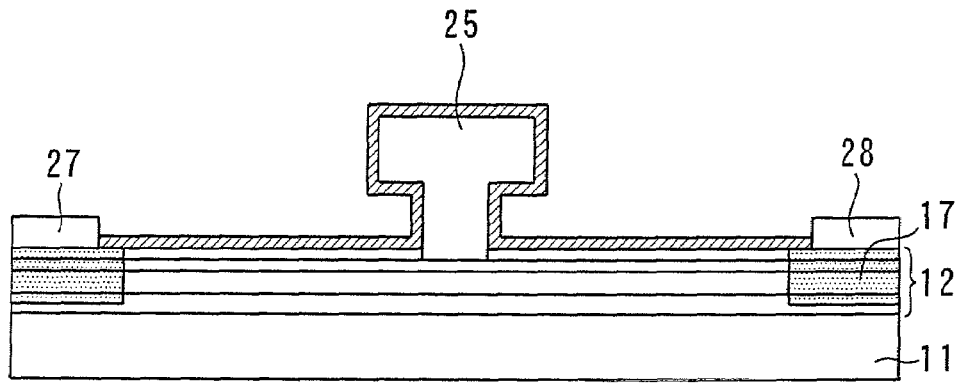
Figure 44:
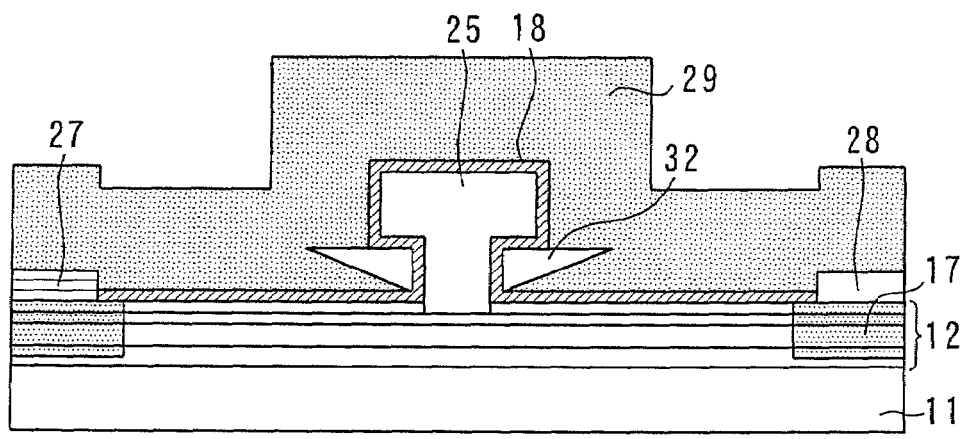
Figure 45:
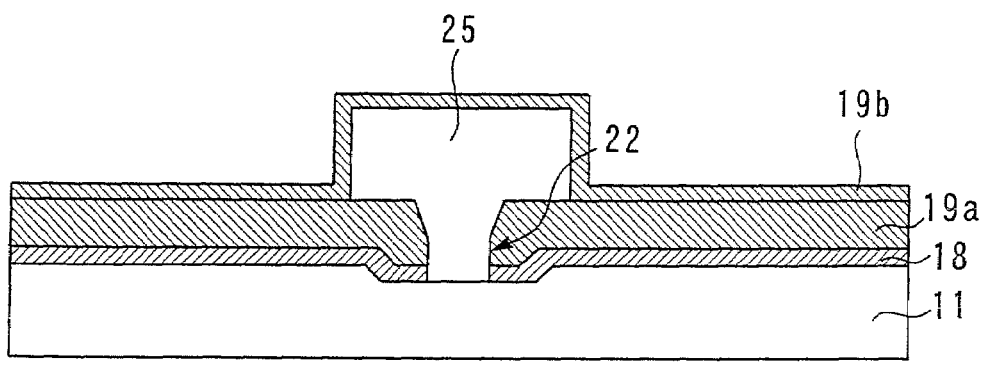
FIGS. 45-48 are sectional views for explaining a method of manufacturing a semiconductor device according to Third conventional embodiment.
Figure 46:
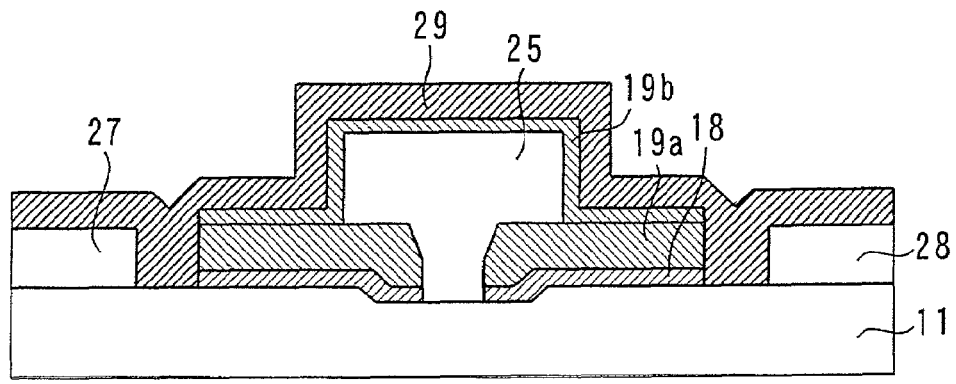
Figure 47:
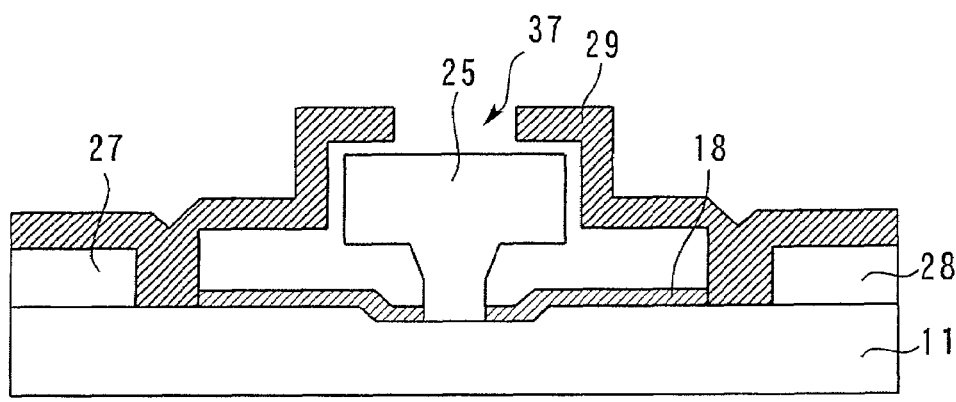
Figure 48:
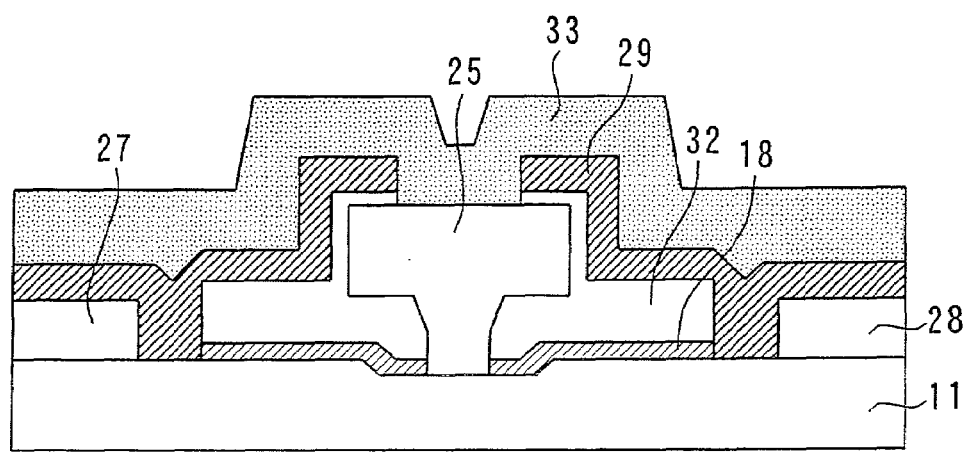

Next, as shown in FIG. 29, the SiN film 18 and the SiN film 29 are coated with a SiN film 33 leaving the hollow portion 32. By the above-described process, the semiconductor device according to the third embodiment is manufactured.

According to the third embodiment, the effects equivalent to the effects of the first embodiment can be obtained. The semiconductor device according to the third embodiment further includes a SOG film 36 formed on the SiN film 29 in the sidewalls of the stretched portion of the T-shaped gate electrode 25. Thereby, the mechanical strength of the SiN film 29 stretched in an umbrella shape can be made higher than the mechanical strength of the SiN film 29 in the first embodiment. Therefore, the SiN film 29 is not missing during the manufacturing process, and a structure having a hollow portion 32 can be more stably manufactured.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-183550, filed on Jul. 12, 2007 including specification, claims, drawings and summary, on which the Convention priority of the present application is based, are incorporated herein by reference in its entirety.

What is claimed is:

1. A semiconductor device comprising:
   a semiconductor layer,
   a first protective insulating film on said semiconductor layer,
   a T-shaped gate electrode on said semiconductor layer and having a top portion,
   a second protective insulating film spread in an umbrella shape from above said T-shaped gate electrode with respect to said semiconductor layer and defining a hollow region between said first protective insulating film and said second protective insulating film, and
   a third protective insulating film coating and contacting both of said first and second protective insulating films, with said hollow region remaining.

2. The semiconductor device according to claim 1 wherein an end portion of said second protective insulating film contacts said first protective insulating film with said hollow region remaining proximate said T-shaped gate electrode in a gate-width direction.

3. A semiconductor device comprising:
   a semiconductor layer,
   a first protective insulating film on said semiconductor layer,
   a T-shaped gate electrode on said semiconductor layer and having a top portion,
   a second protective insulating film spread in an umbrella shape from above said T-shaped gate electrode with respect to said semiconductor layer and defining a hollow region between said first protective insulating film and said second protective insulating film,
   a third protective insulating film coating said first protective insulating film and said second protective insulating film with said hollow region remaining, and
   a reinforcing member on said second protective insulating film in sidewalls of the top portion of said T-shaped gate electrode.

* * * * *